(12) United States Patent
Tseng et al.

(10) Patent No.: US 8,710,593 B2
(45) Date of Patent: Apr. 29, 2014

(54) RESISTOR AND MANUFACTURING METHOD THEREOF

(75) Inventors: Chi-Sheng Tseng, Tainan (TW);
Yao-Chang Wang, Tainan (TW);
Jie-Ning Yang, Ping-Tung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/444,851

(22) Filed: Apr. 12, 2012

(65) Prior Publication Data

US 2013/0270650 A1 Oct. 17, 2013

(51) Int. Cl.
*H01L 27/11* (2006.01)

(52) U.S. Cl.
USPC .... 257/379; 257/358; 257/359; 257/E27.016; 438/171

(58) Field of Classification Search
USPC .......... 257/350, 358, 379, E21.004, E21.616, 257/359, E27.016, E27.035, E29.176; 438/171, 382, 210
See application file for complete search history.

(56) References Cited

U.S. PATENT DOCUMENTS

| 6,558,739 | B1 * | 5/2003 | Liu et al. | 438/627 |
|---|---|---|---|---|
| 7,338,857 | B2 * | 3/2008 | Besana et al. | 438/257 |
| 2010/0155685 | A1 * | 6/2010 | Hurkx | 257/3 |
| 2010/0275965 | A1 * | 11/2010 | Lee et al. | 136/244 |
| 2010/0319763 | A1 * | 12/2010 | Park et al. | 136/255 |
| 2012/0244669 | A1 * | 9/2012 | Liao et al. | 438/212 |
| 2013/0001502 | A1 * | 1/2013 | Jung et al. | 257/4 |
| 2013/0049924 | A1 * | 2/2013 | Yang et al. | 338/314 |
| 2013/0105912 | A1 * | 5/2013 | Hsu et al. | 257/379 |

OTHER PUBLICATIONS

Chen et al., Title of Invention: Semiconductor Structure and Process Thereof, U.S. Appl. No. 13/369,260, filed Feb. 8, 2012.

* cited by examiner

*Primary Examiner* — Jarrett Stark
*Assistant Examiner* — Shahed Ahmed
(74) *Attorney, Agent, or Firm* — Winston Hsu; Scott Margo

(57) ABSTRACT

A manufacturing method for a resistor integrated with a transistor having metal gate includes providing a substrate having a transistor, a transitional structure, and a dielectric layer covering the transistor and the transitional structure formed thereon, forming a recess in between two opposite polysilicon end portions in the transitional structure, forming a U-shaped resistance modulating layer and an insulating layer filling the recess, removing a dummy gate of the transistor and the polysilicon end portions of the transitional structure to form a gate trench and two terminal trenches respectively in the transistor and the transitional structure, and forming a metal gate in the gate trench and conductive terminals in the terminal trenches simultaneously.

8 Claims, 12 Drawing Sheets

RESISTOR AND MANUFACTURING METHOD THEREOF

BACKGROUND OF THE INVENTION

1. Field of the Invention

The invention relates to a resistor and a manufacturing method thereof, and more particularly, to a resistor and a method of manufacturing a resistor integrated with a transistor having metal gate.

2. Description of the Prior Art

To increase the performance of transistors, metal gates are prevalently used in the semiconductor field: the metal gates competent to the high dielectric constant (high-k) gate dielectric layer are used to replace the traditional polysilicon gates to be the control electrode. The metal gate approach can be categorized to the gate first process and the gate last process. And the gate last process gradually replaces the gate first process because a range of material choices for the high-k gate dielectric layer and the metal gate are expanded.

Additionally, resistors are elements which are often used for providing regulated voltage and for filtering noise in a circuit. The resistors generally include polysilicon and silicide layers.

In the current semiconductor field, though the fabricating processes are improved with the aim of reaching high yields, it is found that integration of the manufacturing methods of those different kinds of semiconductor devices is very complicated and difficult. Therefore, a method for fabricating a resistor integrated with a transistor having metal gate is still in need.

SUMMARY OF THE INVENTION

According to an aspect of the present invention, a manufacturing method for a resistor integrated with a transistor having metal gate is provided. The manufacturing method includes providing a substrate having a transistor, a transitional structure, and a dielectric layer covering the transistor and the transitional structure formed thereon; forming a recess in between two opposite polysilicon end portions in the transitional structure; forming a U-shaped resistance modulating (R-modulating) layer in the recess and an insulating layer filling in the recess; removing a dummy gate and the polysilicon end portions of the transitional structure to form a gate trench and a pair of terminal trenches, respectively; and forming a metal gate in the gate trench and conductive terminals in the terminal trenches simultaneously.

According to another aspect of the present invention, a resistor integrated with a transistor having metal gate is provided. The resistor integrated with the transistor includes a substrate; a transistor positioned on the substrate, the transistor comprising a metal gate; and a resistor positioned on the substrate. The transistor includes a metal gate. The resistor further includes a pair of conductive terminals positioned at two opposite ends of the resistor respectively, a U-shaped R-modulating layer positioned in between the conductive terminals; and an insulating layer positioned in between the conductive terminals and encompassed by the U-shaped R-modulating layer.

According to the manufacturing method for a resistor integrated with a transistor having metal gate provided by the present invention, the U-shaped R-modulating layer and the insulating layer are provided to replace the polysilicon main portion of the conventional resistor. Therefore, during removing the polysilicon at where intended to form the conductive terminals, lateral etching is avoided due to the difference between the etching rate of U-shaped R-modulating layer and of the insulating layer and polysilicon. Consequently, profile of the resistor main portion is protected and intact after the etching. As a result, yield of the manufacturing method and reliability and stability of the resistor are all improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 and 10-12 are schematic drawings illustrating a method of manufacturing a resistor integrated with a transistor having metal gate provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 10 is a schematic drawing in a step subsequent to FIG. 6, FIG. 11 is a schematic drawing in a step subsequent to FIG. 10, and FIG. 12 is a schematic drawing in a step subsequent to FIG. 11.

FIGS. 7-9 and 10-12 are schematic drawings illustrating a method of manufacturing a resistor integrated with a transistor having metal gate provided by a second preferred embodiment of the present invention, wherein FIG. 8 is a schematic drawing in a step subsequent to FIG. 7, and FIG. 9 is a schematic drawing in a step subsequent to FIG. 8.

FIG. 10 is a schematic drawing in a step subsequent to FIG. 9,

FIG. 11 is a schematic drawing in a step subsequent to FIG. 10, and

FIG. 12 is a schematic drawing in a step subsequent to FIG. 11.

DETAILED DESCRIPTION

Figure 1:
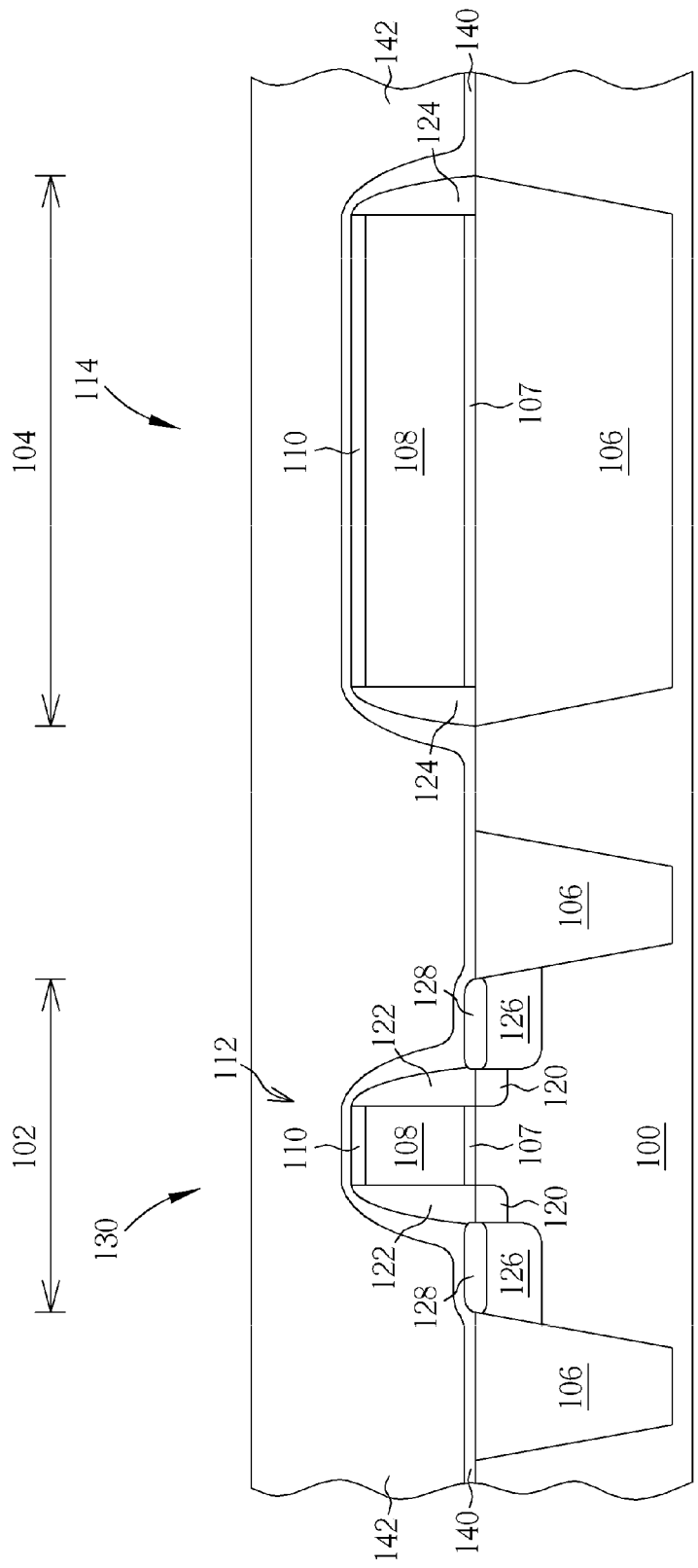

Please refer to FIGS. 1-6, which are schematic drawings illustrating a method of manufacturing a resistor integrated with a transistor having metal gate provided by a first preferred embodiment of the present invention. As shown in FIG. 1, a substrate 100 having a transistor region 102 and a resistor region 104 defined thereon is provided. The substrate 100 also includes a plurality of shallow trench isolations (STIs) 106 positioned in between devices for providing electrical isolation. It is noteworthy that a STI 106 is formed in the resistor region 104 for accommodating a resistor. Then, a dummy gate 112 is formed in the transistor region 104 and a transitional structure 114 is formed in the resistor region 102, respectively. The dummy gate 112 and the transitional structure 114 respectively include a dielectric layer 107, a polysilicon layer 108, and a patterned hard mask 110, which is used to define positions for forming the dummy gate 112 and the transitional structure 114. In the preferred embodiment, the method of manufacturing the resistor integrated with the transistor having metal gate is further integrated with the high-k first process, therefore the dielectric layer 107 serves as the gate dielectric layer and includes a high dielectric constant (high-k) material layer such as rare earth metal oxide. The high-k material layer 107 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

Please refer to FIG. 1 again. Lightly-doped drains (LDDs) 120 are formed in the substrate 100 respectively at two sides of the dummy gate 112. Spacers 122, 124 are formed on sidewalls of the dummy gate 112 and the transitional structure 114, respectively. And a source/drain 126 is formed in the substrate 100 at two sides of the dummy gate 112, particularly at two sides of the spacer 122. Thus a transistor 130 having the dummy gate 112 is formed in the transistor region 102. Additionally, silicide 128 can be formed on surfaces of the source/drain 126 of the transistor 130.

Please still refer to FIG. 1. After forming the transistor 130 and the transitional structure 114, a contact etch stop layer (CESL) 140 and an inter-layer dielectric (ILD) layer 142 are sequentially formed on the substrate 100 to cover the transistor 130 and the transitional structure 114. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the source/drain 126.

Figure 2:
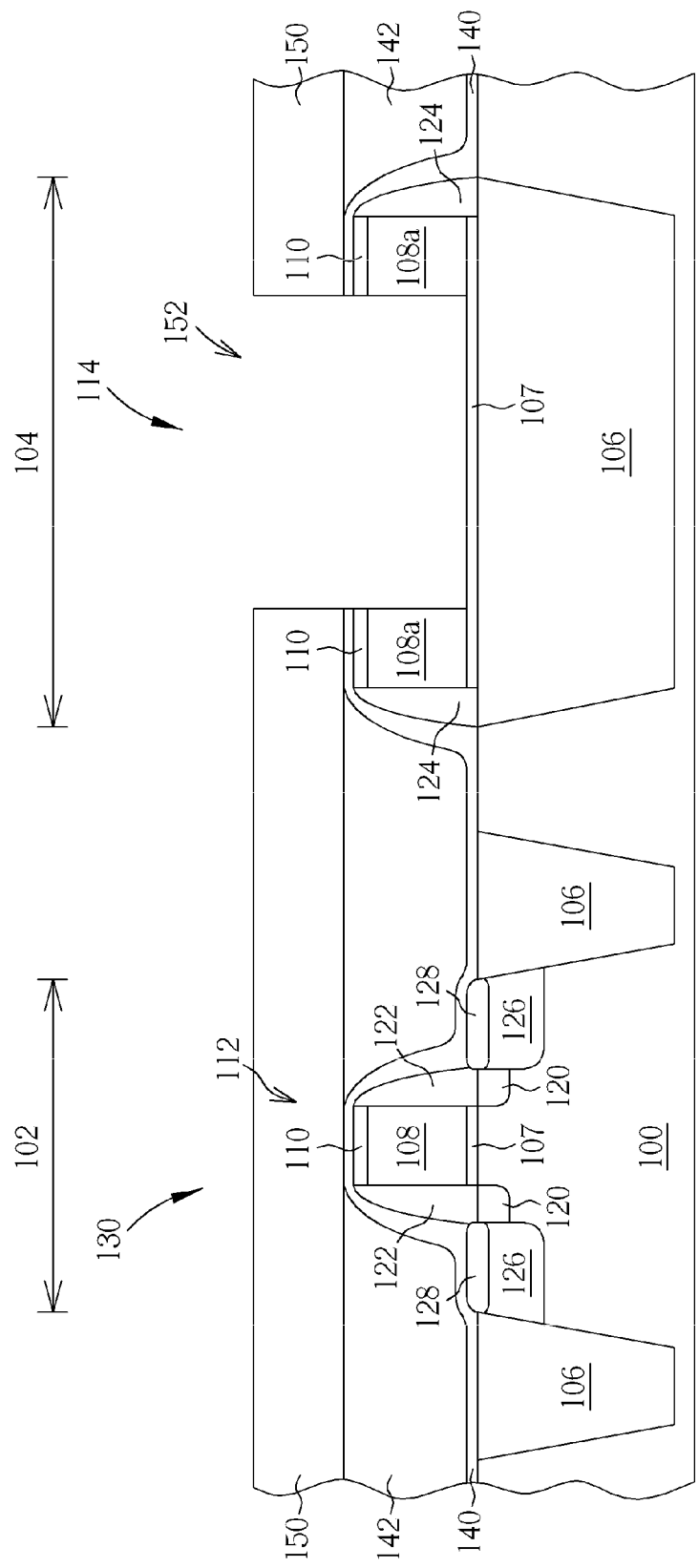

Please refer to FIG. 2. After forming the CESL 140 and the ILD layer 142, a planarization process is performed to remove a portion of the ILD layer 142 to expose the CESL 140 on tops of the transistor 130 and the transitional structure 114. Next, a patterned mask 150, for example but not limited to a patterned photoresist, is formed on the substrate 100. The patterned mask 150 covers the transistor region 102 and portions of the resistor region 114. Particularly, the patterned mask 150 covers two opposite ends of the transitional structure 114. Subsequently, an etching process is performed to remove the exposed CESL 140, the patterned hard mask 110, and a portion of the transitional structure 114. Accordingly, a recess 152 is formed in between the two ends of the transitional structure 114. As shown in FIG. 2, the recess 152 is formed in between two polysilicon end portions 108a, and the high-k material layer 107 is exposed in a bottom of the recess 152 while it is still covered by the polysilicon end portions 108a.

Figure 3:
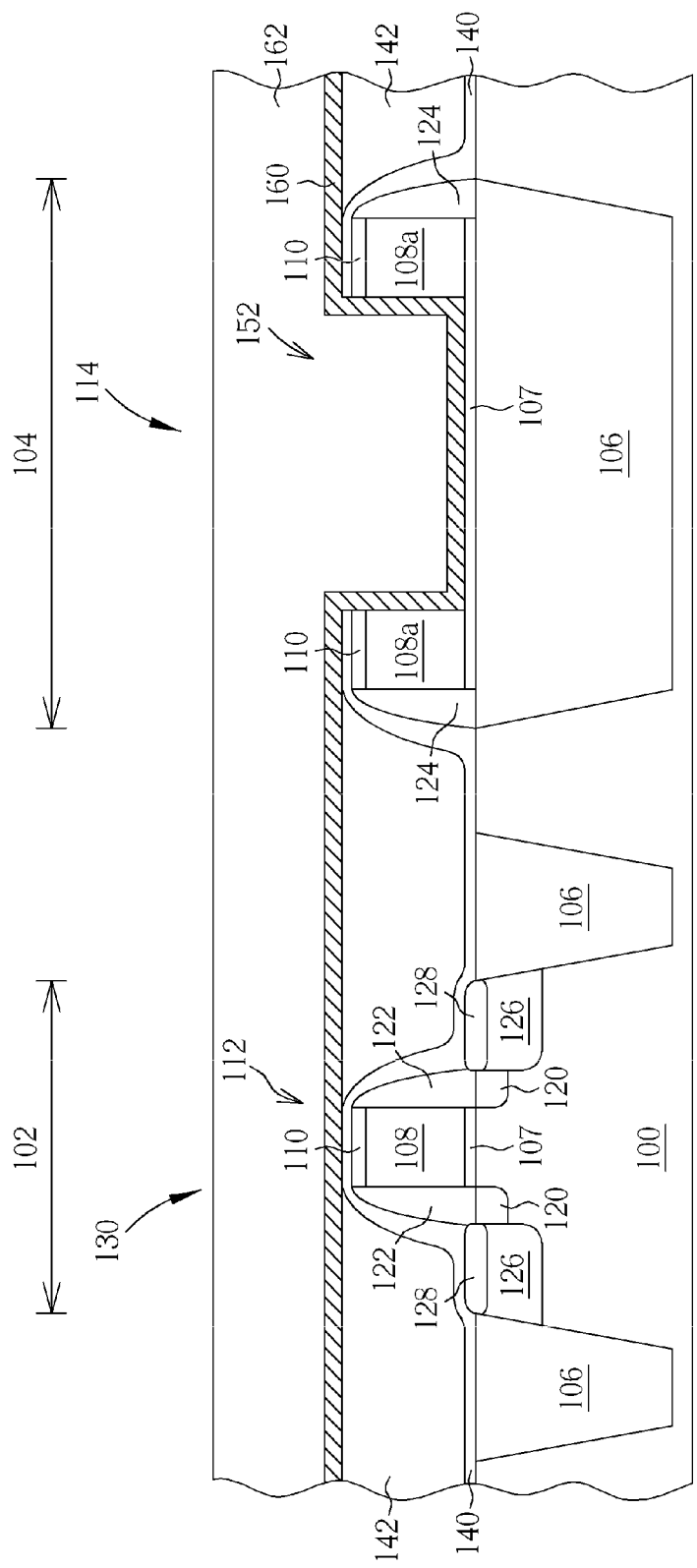

Please refer to FIG. 3. After forming the recess 152, the patterned mask 150 is removed and followed by forming a resistance modulating (R-modulating) layer 160 on the substrate 100. The R-modulating layer 160 covers sidewalls and the bottom of the recess 152 but not fills up the recess 152. It is noteworthy that by choosing materials of the R-modulating layer 160 and adjusting a thickness of the R-modulating layer 160, resistance of the R-modulating layer 160 is tuned to meet the product requirements. For example, the R-modulating layer 160 includes a thickness, and the thickness is between 20 angstroms (Å) and 50 Å. The R-modulating layer 160 can include a multiple metal layer, and the multiple metal layer can include titanium (Ti) and titanium nitride (TiN), but not limited to this. After forming the R-modulating layer 160, a photoresist layer 162 is formed on the substrate 100 to cover the R-modulating layer 160 and further fill up the recess 152.

Figure 4:
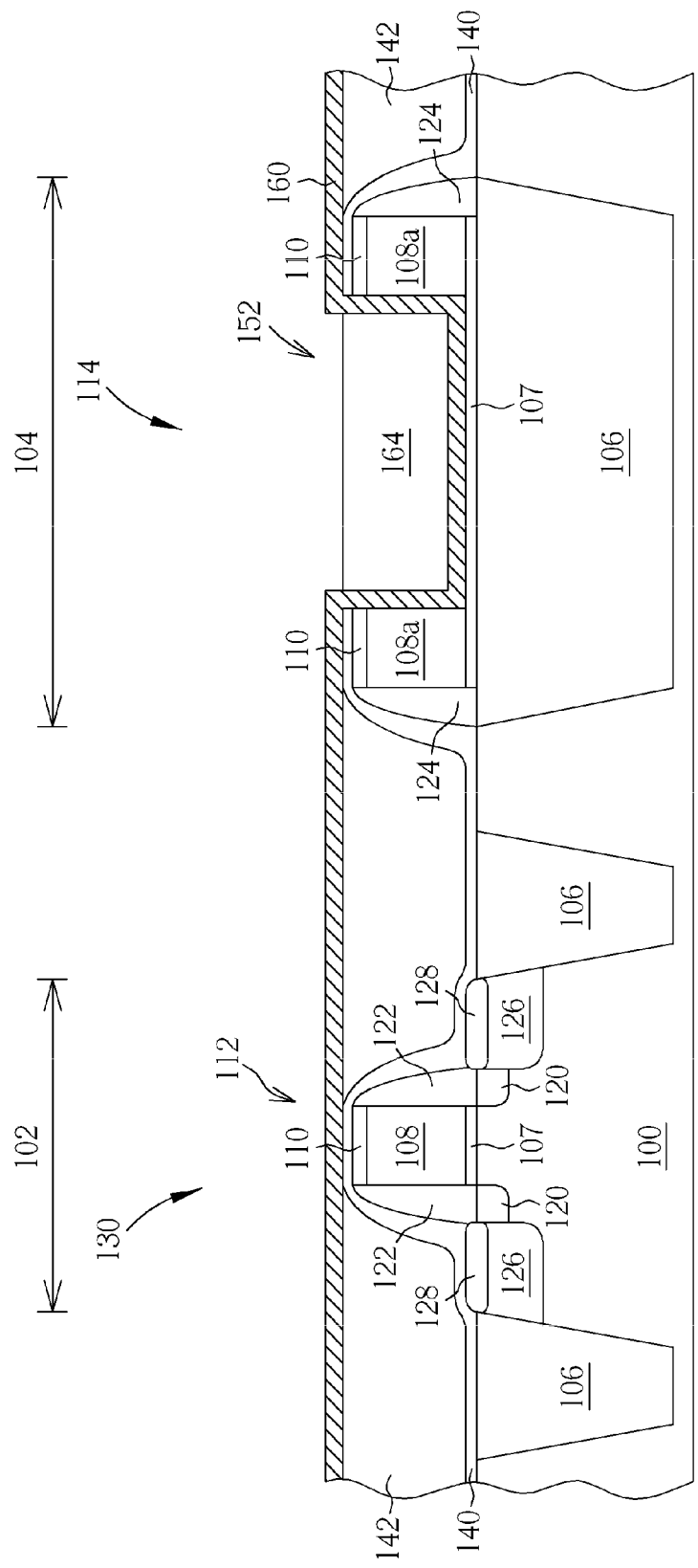

Please refer to FIG. 4. Next, the photoresist layer 162 is etched back to form a patterned photoresist 164 in the recess 152. As shown in FIG. 4, the patterned photoresist 164 remains only in the recess 152 and covers a portion of the R-modulating layer 160 in the recess 152. Furthermore, a surface of the patterned photoresist 164 can be lower than an opening of the recess 152 in the preferred embodiment.

Figure 5:
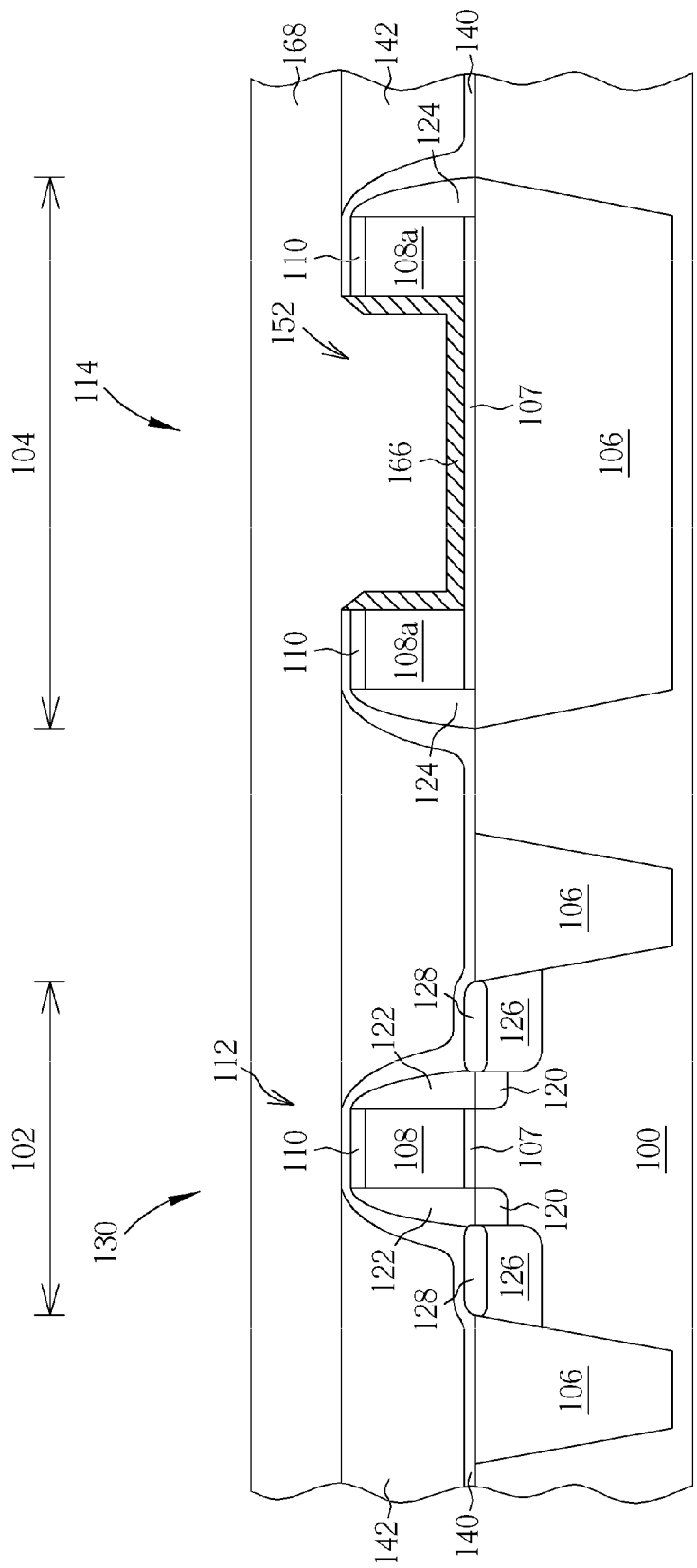

Please refer to FIG. 5. After forming the patterned photoresist 164, an etching process is performed to remove portions of the R-modulating layer 160 not covered by the patterned photoresist 164. Consequently, a U-shaped R-modulating layer 166 is formed in the recess 152. Then, the patterned photoresist 164 is removed and followed by forming an insulating layer 168 filling up the recess 152 on the substrate 100. The insulating layer 168 can include insulating materials having etching rate different from the etching rate of polysilicon, for example but not limited to silicon oxide.

Figure 6:
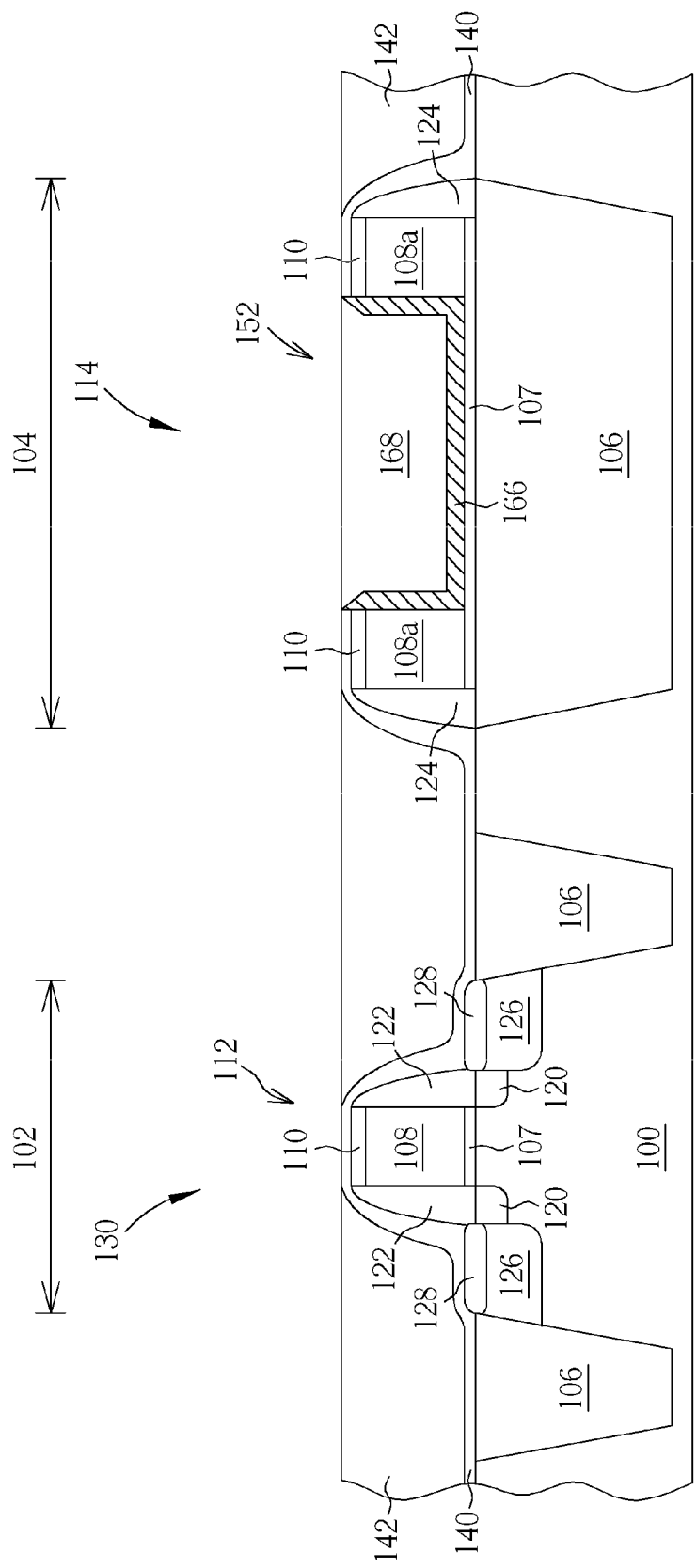

Please refer to FIG. 6. Subsequently, a planarization process is performed to remove portions of the insulating layer 168, thus the insulating layer 168 remains only in the recess 152 and fills up the recess 152. As shown in FIG. 6, a surface of the insulating layer 168 and a surface of the ILD layer 142, even topmost portions of the U-shaped R-modulating layer 166 are substantially coplanar. Additionally, the planarization process can be used to remove portions of the CESL 140 and the patterned hard mask 110. However, removal of the CESL 140 and the patterned hard mask 110 can be performed in advance to removing the polysilicon layer 108 and the polysilicon end portions 108a.

Figure 7:
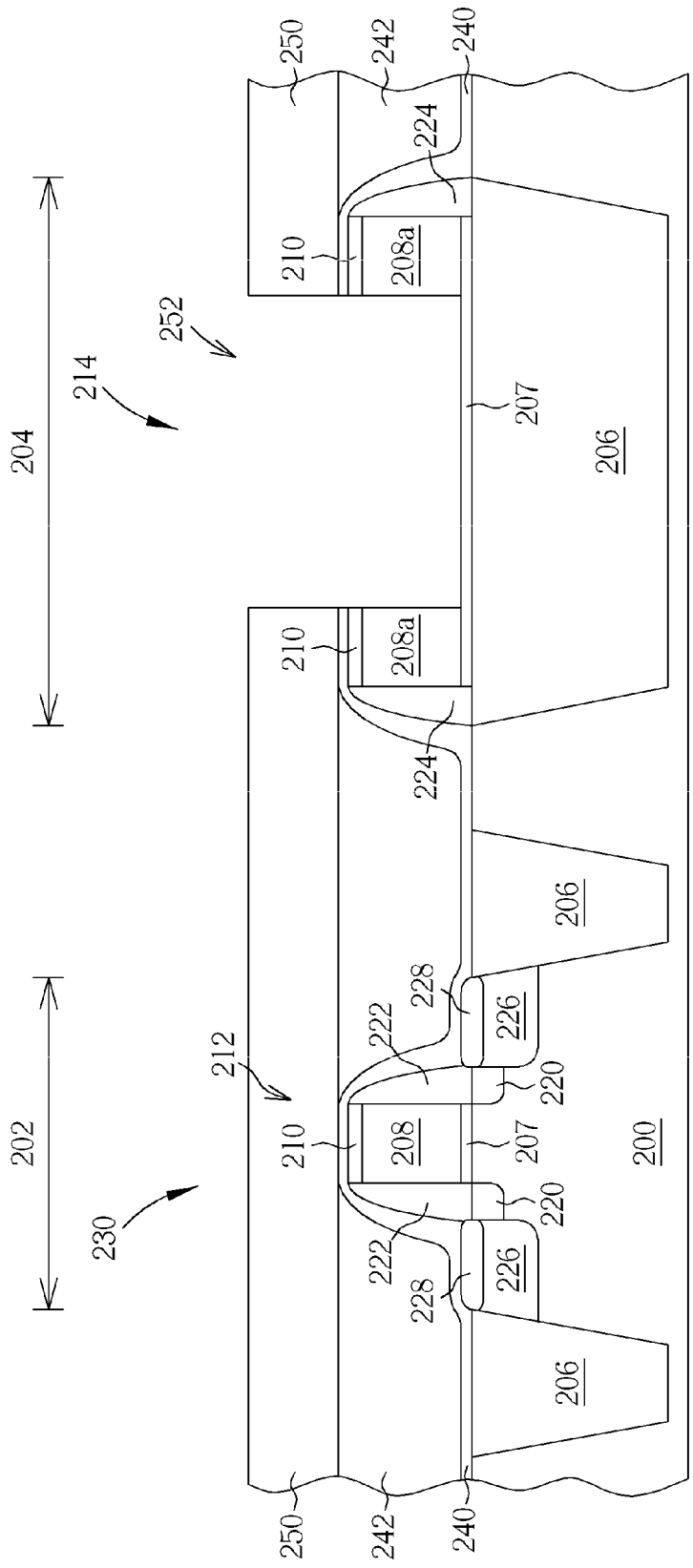
Figure 8:
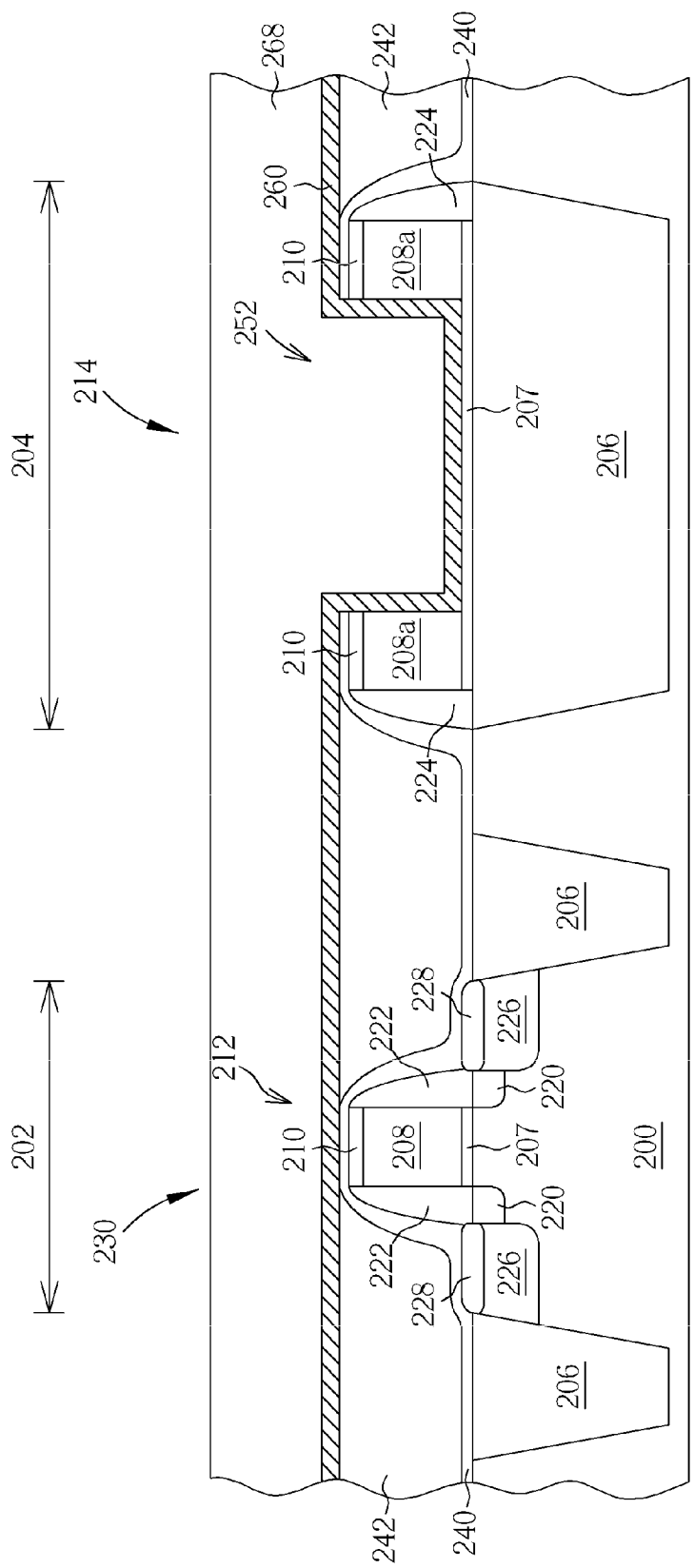
Figure 9:
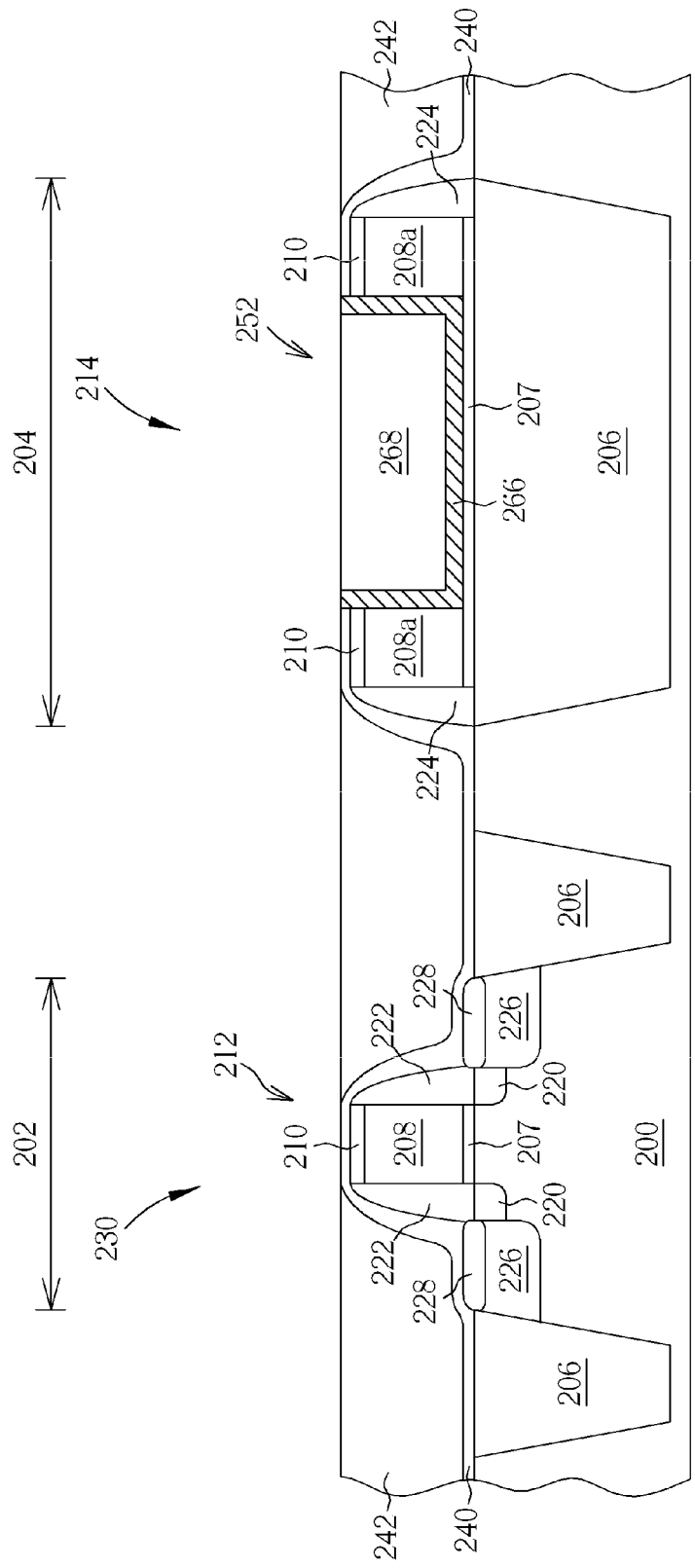

Please refer to FIGS. 7-9, which are schematic drawings illustrating a method of manufacturing a resistor integrated with a transistor having metal gate provided by a second preferred embodiment of the present invention. It is noteworthy that elements the same in both first and second preferred embodiments can include the same material, therefore those details are omitted herein in the interest of brevity. As shown in FIG. 7, a substrate 200 having a transistor region 202 and a resistor region 204 is provided. The substrate 200 also includes a plurality of STIs 206 formed therein. It is noteworthy that a STI 206 is formed in the resistor region 204 for accommodating a resistor. Subsequently, a transistor 230 is formed in the transistor region 202 and a transitional structure 214 is formed in the resistor region 204, respectively. As shown in FIG. 7, the transistor 230 includes a dummy gate 212, LDDs 220, a spacer 222, a source/drain 226, and silicides 228 formed on surface of the source/drain 226. Furthermore, the dummy gate 212 include a high-k gate dielectric layer 207, a polysilicon layer 208, and a patterned hard mask 210 used to define position of the dummy gate 212. The transitional structure 214 includes a dielectric layer 207, a polysilicon layer 208, a patterned hard mask (not shown) used to define position of the transitional structure 214, and a spacer 224. Additionally, silicide 228 can be formed on surfaces of the source/drain 226 of the transistor 230. After forming the transistor 230 and the transitional structure 214, a CESL 240 and an ILD layer 242 covering the transistor 230 and the transitional structure 214 are sequentially formed on the substrate 200.

Please still refer to FIG. 7. After forming the CESL 240 and the ILD layer 242, a planarization process is performed to remove a portion of the ILD layer 242 to expose the CESL 240 on tops of the transistor 230 and the transitional structure 214. Next, a patterned mask 250, for example but not limited to a patterned photoresist, is formed on the substrate 200. The patterned mask 250 covers the transistor region 202 and portions of the resistor region 214. Particularly, the patterned mask 250 covers two opposite ends of the transitional structure 214. Subsequently, an etching process is performed to remove the exposed CESL 240, the patterned hard mask 210, and a portion of the transitional structure 214. Accordingly, a recess 252 is formed in between the two ends of the transitional structure 214. As shown in FIG. 7, the recess 252 is formed in between two polysilicon end portions 208a, and the high-k material layer 207 is exposed in a bottom of the recess 252 while it is still covered by the polysilicon end portions 208a.

Please refer to FIG. 8. After forming the recess 252, the patterned mask 250 is removed and followed by forming a R-modulating layer 260 on the substrate 200. The R-modulating layer 260 covers sidewalls and the bottom of the recess 252 but not fills up the recess 252. It is noteworthy that by choosing materials of the R-modulating layer 260 and adjusting a thickness of the R-modulating layer 260, resistance of the R-modulating layer 260 is tuned to meet the product requirements. For example, the R-modulating layer 260 includes a thickness, and the thickness is between 20 Å and 50 Å. The R-modulating layer 260 can include a multiple metal layer, and the multiple metal layer can include Ti and TiN, but not limited to this. After forming the R-modulating layer 260, a filling layer filling up the recess 252, such as an insulating layer 268 is formed on the substrate 200 according to the preferred embodiment. The insulating layer 268 can include insulating materials having etching rate different from the etching rate of polysilicon, for example but not limited to silicon oxide.

Please refer to FIG. 9. Subsequently, a planarization process is performed to remove portions of the insulating layer 268 and portions of the R-modulating layer 260. The planarization stops at a surface of the CESL 240, thus the insulating layer 268 remains only in the recess 252 and fills up the recess 252. More important, the planarization removes the portions of the R-modulating layer 260 not in the recess 252, thus a U-shaped R-modulating layer 266 is formed in the recess 252. As shown in FIG. 9, a surface of the insulating layer 268, topmost portions of the U-shaped R-modulating layer 266, and a surface of the ILD layer 242 are substantially coplanar. Additionally, the planarization process can be used to remove portions of the CESL 240 and the patterned hard mask 210. However, removal of the CESL 240 and the patterned hard mask 210 can be performed in advance to removing the polysilicon layer 208 and the polysilicon end portions 208a.

Figure 10:
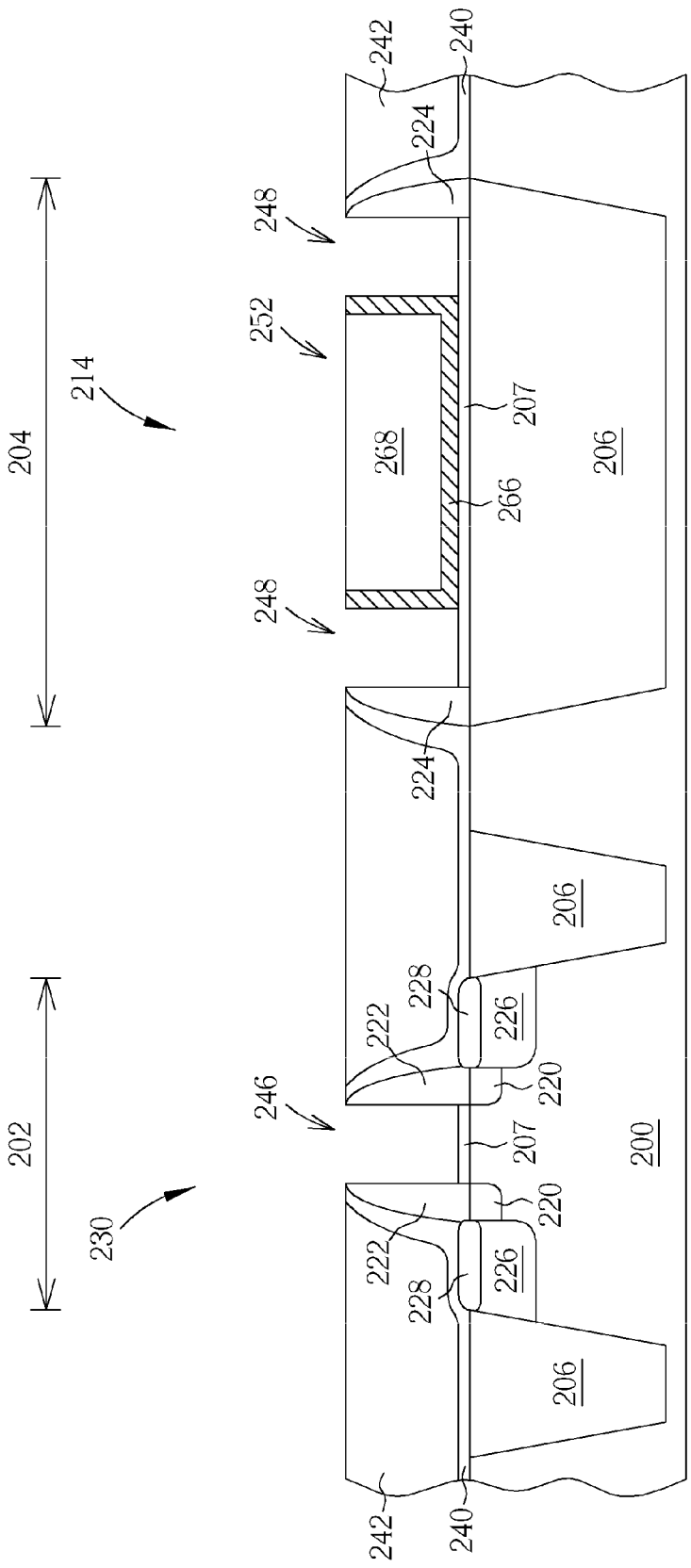
Figure 11:
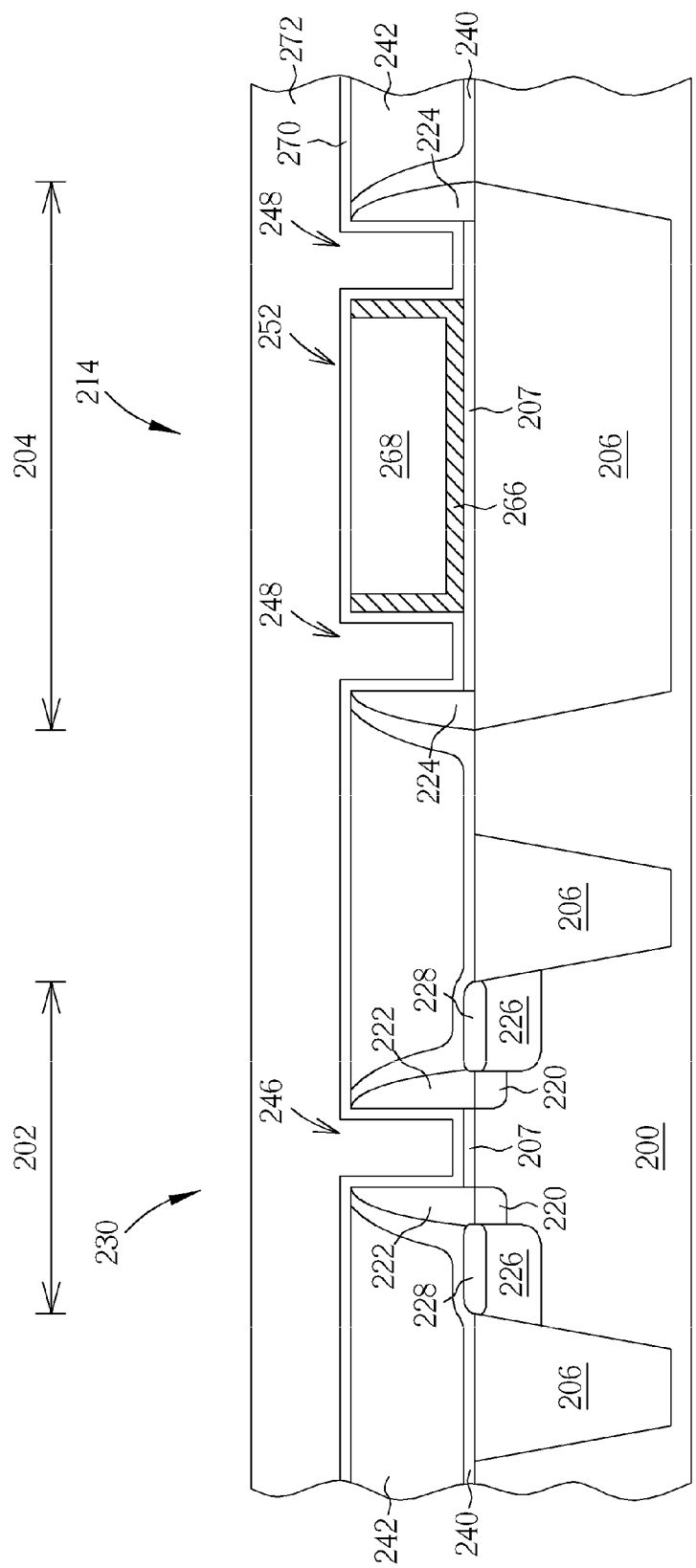
Figure 12:
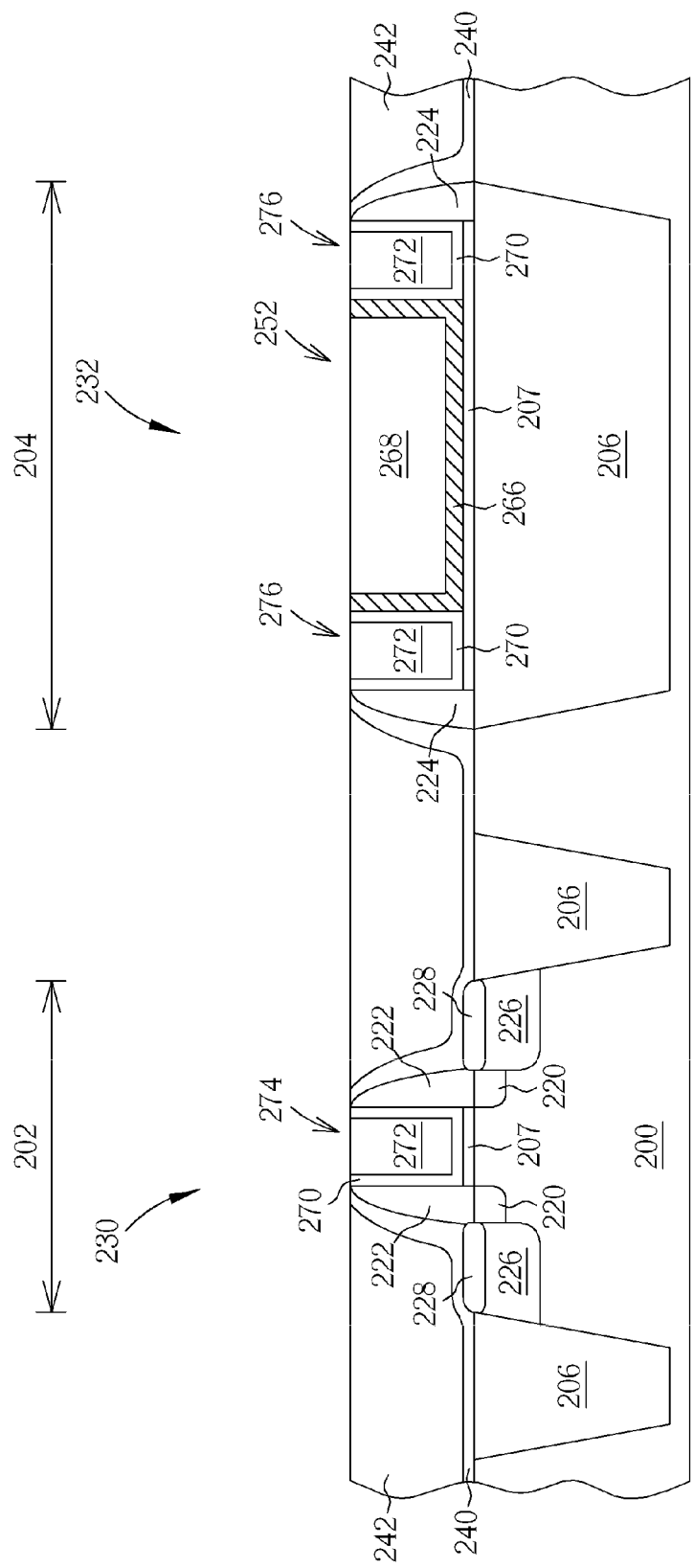

Please refer to FIGS. 10-12. It should be noted that although elements depicted in FIGS. 10-12 are designated by numerals the same in FIGS. 7-9, steps shown in FIGS. 10-12 can be performed after the planarization as shown in FIG. 6 of the first preferred embodiment. As shown in FIG. 10, after performing the planarization process to form the U-shaped R-modulating layer 266 and the insulating layer 268 that only in the recess 252, a dry or wet etching process is directly performed to remove the dummy gate 212 and the polysilicon end portions 208a. Consequently, a gate trench 246 is formed in the transistor 230 and two terminal trenches 248 are formed respectively at the two opposite ends of the transitional structure 214. In another approach, a patterned hard mask covering portions of the transitional structure 214, particularly the U-shaped R-modulating layer 266 and the insulating layer 268, but exposing the polysilicon end portions 208a and the dummy gate 212 can be formed on the substrate 200. Then, a suitable etching process is performed to remove the exposed polysilicon end portions 208a and the dummy gate 212 to form the above mentioned gate trench 246 and terminal trenches 248. As mentioned above, since the preferred embodiments are integrated with the gate-last process and the high-k first process, the high-k material layer 207 is exposed in bottoms of the gate trench 246 and the terminal trenches 248 and is used to protect the underneath substrate 200.

Please refer to FIG. 11. After forming the gate trench 246 and the terminal trenches 248, a chemical vapor deposition (CVD) process or a physical vapor deposition (PVD) is performed to form a work function metal layer 270 in the gate trench 246 and the terminal trenches 248. According to the preferred embodiment, the work function metal layer 270 can include suitable materials providing an appropriate work function for p-type transistor or n-type transistor. Furthermore, the work function metal layer 270 can be a single-layered structure or a multilayered structure. Additionally, a bottom barrier layer (not shown) can be formed between the work function metal layer 270 and the dielectric layer 207 if required. The bottom barrier layer can include TiN, but not limited to this.

Please refer to FIG. 11. Next, a filling metal layer 272 is formed on the work function metal layer 270 in the gate trench 246 and the terminal trenches 248. The filling metal layer 272 fills up the gate trench 246 and the terminal trenches 248, and includes materials with low resistivity and superior gap-filling characteristic, such as aluminum (Al), titanium aluminide (TiAl) or titanium aluminum oxide (TiAlO), but not limited to this. Additionally, a top barrier layer (not shown) can be formed between the work function metal layer 270 and the filling metal layer 272 if required.

Please refer to FIG. 12. Subsequently, a planarization process such as a CMP process is performed to remove the unnecessary filling metal layer 272 and work function metal layer 270. Consequently, a transistor 230 having a metal gate 274 is formed in the transistor region 202, simultaneously, a pair of conductive terminals 276 is formed in the terminal trenches 248 and a resistor 232 is obtained in the resistor region 204. As shown in FIG. 12, the metal gate 274 includes a multiple metal layer having the U-shaped work function metal layer 270 and the filling metal layer 272. The high-k material layer 207 is formed between the metal gate 274 and the substrate 200. The resistor 232 includes the conductive terminals 276 which has the multiple metal layer the same with the metal gate 274, the U-shaped R-modulating layer 266 between the conductive terminals 276, and the insulating layer 268 between the conductive terminals 276 and encompassed by the U-shaped R-modulating layer 266. As shown in FIG. 12, the high-k material layer 207 is positioned between the conductive terminals 276 and the substrate 200, and between a bottom of the U-shaped R-modulating layer 266 and the substrate 202. Furthermore, the surface of the insulating layer 268, a top of the metal gate 274, and tops of the conductive terminals 276, and even topmost portions of the U-shaped R-modulating layer 266 are all coplanar.

According to the manufacturing methods of a resistor integrated with a transistor having metal gate of the first and second preferred embodiment, the U-shaped R-modulating layer 166/266 and the insulating layer 168/268 are used to replace the polysilicon main portion of the conventional resistor. Furthermore, by choosing materials of the U-shaped R-modulating layer 166/266 and adjusting a thickness of the U-shaped R-modulating layer 166/266, resistance of the U-shaped R-modulating layer 166/266 is tuned to meet the product requirements. More important, during removing the polysilicon end portions 108a/208a, the etching rates of the U-shaped R-modulating layer 166/266 and the insulating layer 168/268 prevent the lateral etching so that the main portions of the resistor is impervious and thus remains intact profile.

Accordingly, the manufacturing method for a resistor integrated with a transistor having metal gate is easily integrated with the metal gate approach. By replacing the polysilicon main portion of the conventional resistor with the U-shaped R-modulating layer and the insulating layer, lateral etching that is often found when removing the polysilicon end portions is avoided due to the difference between the etching rate of U-shaped R-modulating layer and of the insulating layer and polysilicon. Consequently, profile of the resistor main portion is protected and impervious to the etching. Furthermore, by choosing materials of the U-shaped R-modulating layer and adjusting a thickness of the U-shaped R-modulating layer, resistance of the R-modulating layer is tuned to meet the product requirements. As a result, yield of the manufacturing method and reliability and stability of the resistor are all improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistor integrated with a transistor having metal gate, comprising:
   a substrate;
   a transistor positioned on the substrate, the transistor comprising a metal gate; and
   a resistor positioned on the substrate, the resistor further comprising:
      a pair of conductive terminals positioned at two opposite ends of the resistor respectively;
      a U-shaped R-modulating layer positioned in between the conductive terminals; and
      an insulating layer positioned in between the conductive terminals and encompassed by the U-shaped R-modulating layer,
      wherein the U-shaped R-modulating layer is in contact with both the conductive terminal and the insulating layer.

2. The resistor integrated with the transistor having metal gate according to claim 1, wherein a surface of the insulating layer, a top of the metal gate, and tops of the conductive terminals are all coplanar.

3. The resistor integrated with the transistor having metal gate according to claim 1, further comprising a high-k material layer positioned between the metal gate and the substrate, between the conductive terminals and the substrate, and between a bottom of the U-shaped R-modulating layer and the substrate.

4. The resistor integrated with the transistor having metal gate according to claim 1, wherein the U-shaped R-modulating layer comprises a thickness and the thickness is between 20 Å and 50 Å.

5. The resistor integrated with the transistor having metal gate according to claim 1, wherein the U-shaped R-modulating layer comprises a first multiple metal layer.

6. The resistor integrated with the transistor having metal gate according to claim 5, wherein the first multiple metal layer comprises titanium and titanium nitride.

7. The resistor integrated with the transistor having metal gate according to claim 1, wherein the metal gate and the conductive terminals comprise a second multiple metal layer.

8. The resistor integrated with the transistor having metal gate according to claim 7, wherein the second multiple metal layer comprises a U-shaped work function metal layer and a filling metal layer.

* * * * *